(12) United States Patent
Nakagawa et al.

(10) Patent No.: US 6,661,281 B2
(45) Date of Patent: Dec. 9, 2003

(54) METHOD FOR REDUCING CURRENT SURGE USING MULTI-STAGE RAMP SHUNTING

(75) Inventors: Osamu Samuel Nakagawa, Redwood City, CA (US); Norman Chang, Fremont, CA (US); Shen Lin, Foster City, CA (US); Weize Xie, Cupertino, CA (US); Xuejue Huang, Richmond, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/995,639

(22) Filed: Nov. 29, 2001

(65) Prior Publication Data

US 2003/0098742 A1 May 29, 2003

(51) Int. Cl.[7] .............................. H03B 1/00; H03K 5/00; H04B 1/10
(52) U.S. Cl. ........................ 327/554; 327/311; 327/558
(58) Field of Search ................................. 327/311, 551, 327/553, 554, 545, 558; 333/312–316

(56) References Cited

U.S. PATENT DOCUMENTS

| | | | |
|---|---|---|---|
| 3,935,511 A | | 1/1976 | Boulanger et al. |
| 5,079,455 A | | 1/1992 | McCafferty et al. |
| 5,298,797 A | * | 3/1994 | Redl .......................... 327/311 |
| 5,627,736 A | * | 5/1997 | Taylor ......................... 363/39 |
| 5,726,849 A | | 3/1998 | Nakamura |
| 5,914,633 A | * | 6/1999 | Comino et al. ............. 327/552 |
| 6,328,212 B1 | * | 12/2001 | Metlitasky et al. .... 235/462.16 |
| 6,417,727 B1 | * | 7/2002 | Davis .......................... 327/553 |

* cited by examiner

*Primary Examiner*—Terry D. Cunningham
*Assistant Examiner*—Quan Tra

(57) ABSTRACT

A method reduces noise resulting from a current surge in a circuit. A plurality of loading elements, parallel with the circuit being protected, are connected sequentially and disconnected. The connection of the loading elements results in a ramping up of current through the circuit without a sudden surge. In a preferred embodiment, an apparatus for slowing a current change in a circuit is described. The apparatus comprises a plurality of loading elements placed in parallel with the circuit, each of the elements providing a path for current flow, and a control circuit for selectively opening or closing at least one of said paths to prevent or enable current flow through the at least one of the paths.

26 Claims, 3 Drawing Sheets

METHOD FOR REDUCING CURRENT SURGE USING MULTI-STAGE RAMP SHUNTING

FIELD OF THE INVENTION

This invention relates generally to suppression of noise, and more particularly to suppression of noise resulting from current surges in an integrated circuit.

BACKGROUND OF THE INVENTION

Current surges in circuits comprising electronic components are well known. A current surge is a sudden, almost instantaneous, change (usually an increase) in the current that is flowing through a circuit or a component. In an integrated circuit, such a surge may result from a circuit block within the integrated circuit waking up from a sleep mode, for example. A current surge or large change in current is illustrated in FIG. 1.

In FIG. 1, the current I is, initially, at a low value $I_L$ while a circuit block is in a sleep mode. This mode may result from inactivity or low activity of the circuit block for a predetermined amount of time or until a certain event occurs. Upon expiration of the predetermined amount of time or the occurrence of a triggering event, such as the activation of the circuit block (i.e., no longer in a sleep mode) at time $t_H$ for example; a current surge takes place. The surge may be caused by many factors such as an increase in impedance in another part of the integrated circuit relative to the impedance in the circuit block for example. Since the circuit block is no longer in the sleep mode, it may be considered to be in a wake-up mode. At time $t_H$, therefore, the value of the current $I_L$ increases drastically to a much higher value $I_H$ almost instantly. The current in the circuit block may remain at this value (i.e., $I_H$) until another sleep mode at time $t_L$ decreases the current to $I_L$. In addition to subjecting circuit components to stresses, a large change in the current results in undesirable noise. Among other things, noise causes power and ground bounce that reduces the driving capability of a transistor leading to timing errors.

Other approaches for suppression of current surge include U.S. Pat. No. 5,726,849 (issued to Nakamura) for example. In Nakamura, a resistor element in parallel with a switching element is connected in series with an input circuit to break the circuit in response to an overcurrent or over heating. Another approach is the method of U.S. Pat. No. 5,079,455 (issued to McCafferty et al.), which discloses a current limiting circuit. Yet another approach is disclosed in U.S. Pat. No. 3,935,511 (issued to Boulanger et al.). According to Boulanger, a resistive device is provided in series with a load at initial turn-on, the device being shunted once the current inrush has passed.

Each of these patents involve the placement of a protective circuit (or circuit element) in series with another circuit (or circuit element) that is being protected from a current surge. The protection of circuit elements from current surge is needed in these patents as the elements cannot tolerate the current surge. Current surge subjects unprotected circuit elements to conditions that the elements are not designed for. As a result, the elements malfunction or more likely, the elements are destroyed.

SUMMARY OF THE INVENTION

In one aspect, the invention relates to a method for reducing noise resulting from a current surge in a circuit. The method includes the steps of sequentially connecting a plurality of loading elements in parallel with the circuit and disconnecting the loading elements.

In other aspect, the invention relates to an apparatus for slowing a current change in a circuit. The apparatus includes a plurality of loading elements placed in parallel with the circuit where the elements provide a path for current flow and a control circuit for selectively opening or closing at least one of the paths to prevent or enable current flow through the at least one of the paths. Accordingly, the apparatus protects circuits from noise resulting from a large and sudden current change. Moreover, the apparatus provides for a gradual ramping up of the current flowing through the circuit block such that large and sudden changes in the amount of current flow as well as the resulting noise in the circuit block are reduced or eliminated.

In yet another aspect, the invention relates to a circuit for decreasing noise resulting from current surges. The circuit includes a first node, a second node, a circuit block connected between the first node and the second node, and a ramp loading circuit connected between the first node and the second node where the ramp loading circuit includes a plurality of loading elements placed in parallel with the circuit block where each of the elements provide a path for current flow and a control circuit that selectively opens or closes at least one of the paths to prevent or enable current flow through the at least one of the paths.

In comparison to known prior art, certain embodiments of the invention are capable of achieving certain advantages, including some or all of the following: (1) methods and apparatus are capable of converging to a better solution than prior art solutions; and (2) the methods and apparatus are adaptable to variations from device to device. Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 2:
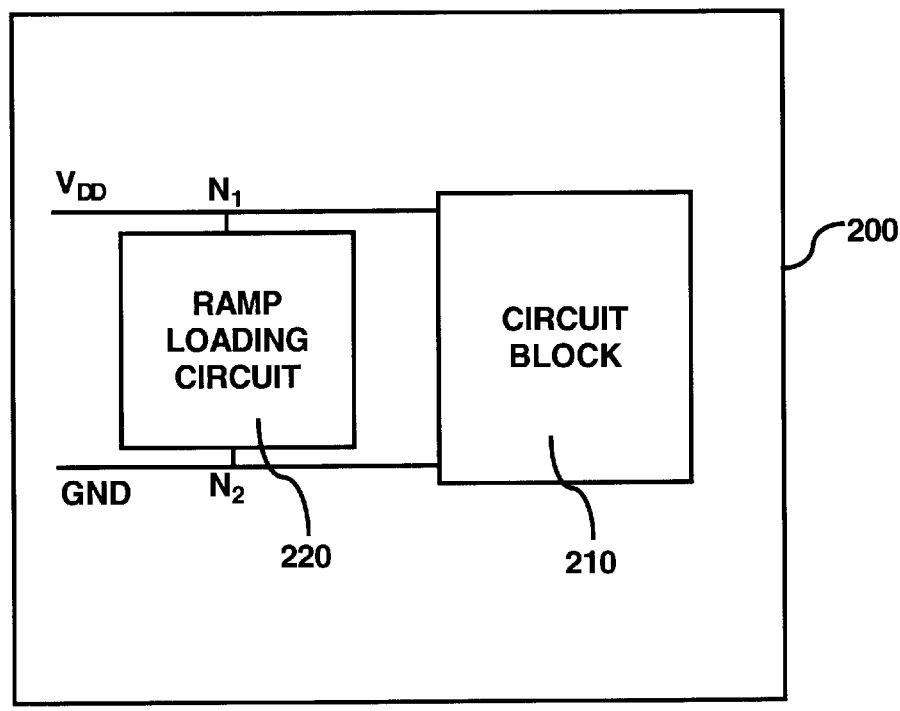
FIG. 2 illustrates an exemplary integrated circuit having a ramp loading circuit according to an embodiment of the invention.

FIG. 2 is a block diagram illustrating an integrated circuit 200. Although one embodiment involves an integrated circuit, the invention is not so limited; the circuit 200 may be any circuit. The circuit 200 includes a circuit block 210 that is subject to noise resulting from current surges. The circuit 200 also includes a ramp loading circuit 220, in parallel with the circuit block 210, for eliminating the noise from a current surge according to an exemplary embodiment of the invention. The ramp loading circuit is placed between a voltage source ($V_{DD}$) and ground (GND). Unlike other circuits that are protected from current surges, the circuit block 210 is designed to tolerate the current surge without disabling or destroying components of the circuit block 210.

A circuit, such as the circuit block 210, may experience a current surge under a plurality of conditions. As one example of such a condition, a circuit block may enter a sleep mode which is well known. In such a mode, the circuit block operates in a less than a fully active state. Sleep mode is typically a standby mode as well. A circuit (or circuit block such as 210) may be activated from a sleep mode upon the occurrence of an event, including time lapse. At this point, the circuit enters an active state. This transition often leads to a current surge and the corresponding noise. The invention overcomes the noise by utilizing the ramp loading circuit 220.

Figure 3:
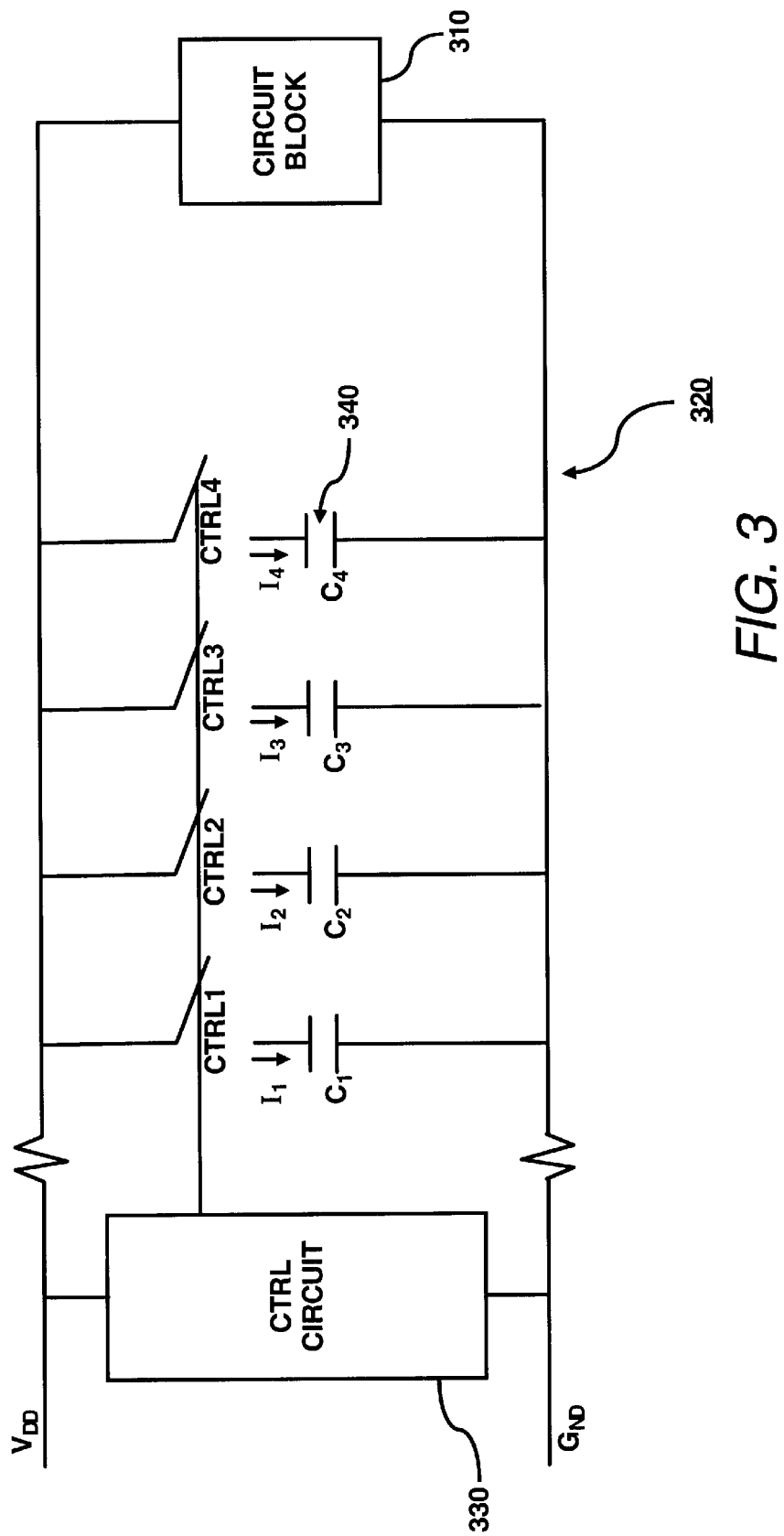
FIG. 3 illustrates an exemplary ramp loading circuit with a plurality of active loading elements and a control circuit for activating the ramp loading circuit.

FIG. 3 illustrates an exemplary embodiment of a ramp loading circuit 220 of FIG. 2. The ramp loading circuit of FIG. 3 (labeled as 320) includes a control circuit 330 and a plurality of active loads (or, impedance elements) 340. For purely illustrative purposes, four such active loads are shown. The number may be greater than or less than four. The control circuit 330 may be programmed or designed to foresee a current surge and activate the multi-stage ramp shunting of the ramp loading circuit 320. Such ability to foresee a current surge is described in a concurrently filed patent application assigned to assignee of the present invention and entitled "Power Reduction Based On Ramp Up/Down Techniques With N Cycles Prediction", the entire subject of which is incorporated herein by reference.

Figure 4:
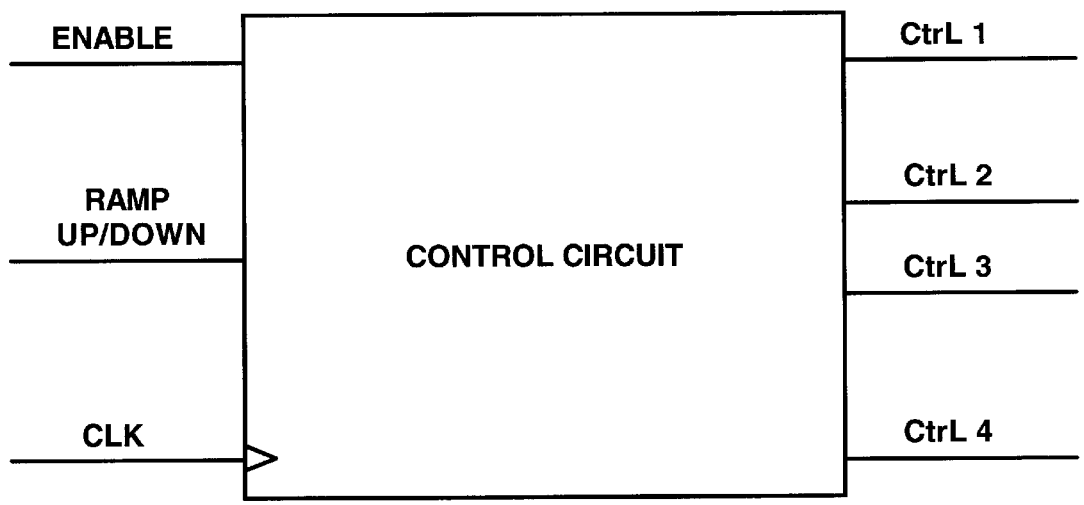
FIG. 4 illustrates an exemplary block diagram of a control circuit for controlling the ramp loading circuit according to an embodiment of the invention.

The control circuit 330, upon recognizing or foreseeing a current surge (or, the circuit block waking up), may close the CTRL1 path of FIG. 3 (or transfers to an "on" position) during a clock cycle of the control circuit of FIG. 4. This path (i.e., the CTRL1 path) includes a capacitive element $C_1$. As a result, an impedance is introduced or created and a path for current flow $I_1$ is created between the $V_{DD}$ and GND terminals through the CTRL1 path of the ramp loading circuit 320 (of FIG. 3). The capacitor $C_1$ is charged to the value of $I_1$. Once the capacitor is fully charged, current cannot flow through the capacitor $C_1$. Therefore, the current $I_1$ is forced to flow through the circuit block 310. The circuit block 210 (of FIG. 2) may still be in a sleep (or, inactive/standby) mode during and after this clock cycle. At this time, there is no current flow through CTRL2, CTRL3 and CTRL4 paths as they are all open.

During a next clock cycle, the CTRL2 path may be closed in addition to the CTRL1 path being closed. As a result, an additional impedance element $C_2$ is in parallel with $C_1$. This arrangement results in a decrease in the total impedance of the ramp loading circuit 320 and an increase in the current flow between terminal $V_{DD}$ and GND. With both CTRL1 and CTRL2 paths being closed, the current may be labeled as $I_2$.

Similarly, during a third clock cycle, CTRL3 path may be closed (in addition to CTRL1 and CTRL2) and a third impedance element $C_3$ is in parallel with $C_1$ and $C_2$. This results in a further decrease in the total impedance of the ramp loading circuit 320 and another increase in the current flow between $V_{DD}$ and GND that may be labeled as $I_3$.

Finally, in the illustrated example, during the next clock cycle, CTRL4 path may be closed and a fourth impedance element $C_4$ is in parallel with $C_1$, $C_2$ and $C_3$. Again, this results in a yet another decrease in the total impedance of the ramp loading circuit 320 and another increase in the current flow between $V_{DD}$ and GND that may be labeled as $I_4$. The above-described changes in the current flow are shown in Table 1.

TABLE 1

|       | Cycle 0 | Cycle 1 | Cycle 2 | Cycle 3 | Cycle 4 | Cycle 5 |
|-------|---------|---------|---------|---------|---------|---------|
| Ctrl1 | Off     | On      | On      | On      | On      | Off     |
| Ctrl2 | Off     | Off     | On      | On      | On      | Off     |
| Ctrl3 | Off     | Off     | Off     | On      | On      | Off     |
| Ctrl4 | Off     | Off     | Off     | Off     | On      | Off     |

Figure 1:
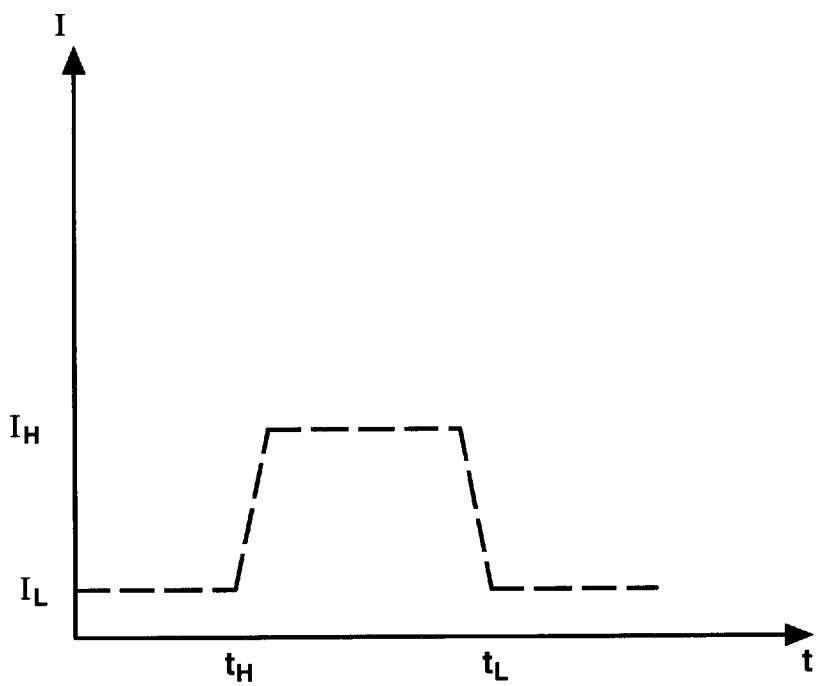
FIG. 1 illustrates current surge in a circuit block of an integrated circuit.
Figure 5:
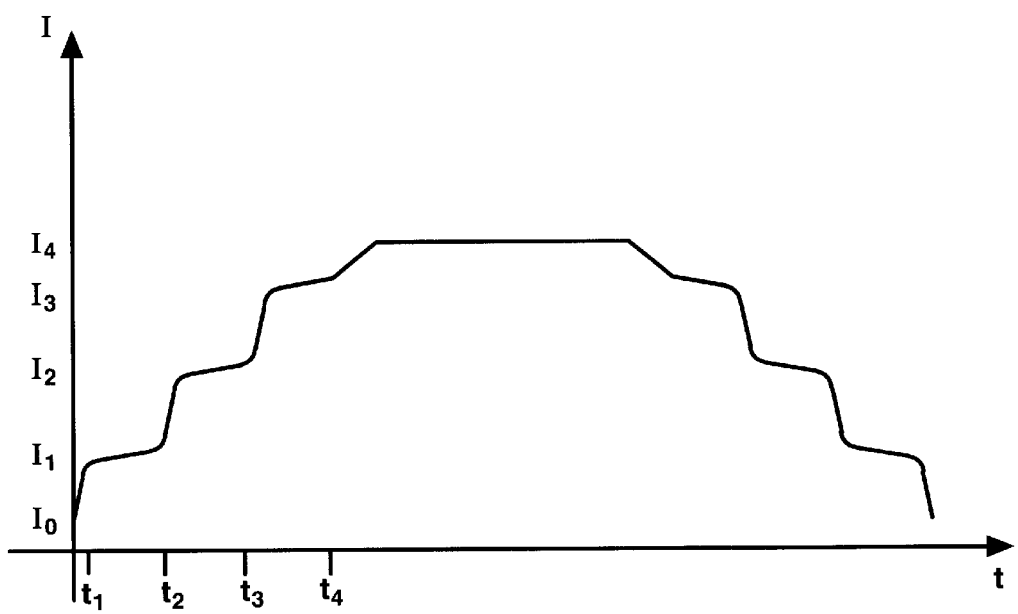
FIG. 5 illustrates a gradual ramping of current to a circuit block according to an embodiment of the invention.

The clock cycles may be programmed so that upon the current flow reaching the value of $I_4$, the circuit block 210 (of FIG. 2) reaches a wake-up or active state. Since the value of the current flow has increased in stages, the current flow between the terminals $V_{DD}$ and GND has a reached a maximum value without a surge. Therefore, noise resulting from such a current surge has been reduced or eliminated. The increase of the current flow in stages is illustrated in FIG. 5. This is in contrast to the current surge illustrated in FIG. 1.

While the invention has been described with reference to four active loading paths (or, impedance elements), it is not restricted to such a number. It may be greater or lesser than the number illustrated. Similarly, while successive clock cycles have been identified as closing the CTRL paths in FIG. 3, every other clock cycle may be used to achieve the result. Even fractions of a cycle, such as a half cycle, may also be used. A clock cycle may also be skipped; that is, during the first clock cycle, CTRL1 path may be closed, during the second clock cycle, CTRL2 path may be closed and during the fourth cycle, CTRL3 path may be closed, etc.

The above described method is directed to a current increase (i.e., ramping up). A variation of this method may be used to address ramping down as well. The current flow in this case is decreasing. Therefore, the current flow is initially at a high value, such as $I_4$. This results from each of CTRL1, CTRL2, CTRL3 and CTRL4 paths of FIG. 3 being in a closed position.

The control circuit 330, upon recognizing a current surge (or, the circuit block 210 going to a sleep or standby or less than active state), opens the CTRL4 path of FIG. 3 (or transfers to an "off" position) during a clock cycle of the control circuit of FIG. 4. As a result, only three paths for a current flow are available between the $V_{DD}$ and GND terminals through CTRL1, CTRL2 and CTRL3 (with three impedance elements $C_1$, $C_2$ and $C_3$) paths of the ramp loading circuit 320 (of FIG. 3). There is no current flow through CTRL4 path. In removing parallel impedance element $C_4$ by opening the CTRL4 path, the total impedance is increased and the current flow decreases from $I_4$ to $I_3$.

During a next clock cycle, the CTRL3 path may be opened in addition to the CTRL4 path being open. As a result, another parallel impedance element $C_3$ is removed. This arrangement results in an increase in the total impedance of the ramp loading circuit 320 and a decrease in the current flow between terminal $V_{DD}$ and GND from $I_3$ to $I_2$.

Similarly, during a third clock cycle, CTRL2 path may be opened (in addition to CTRL3 and CTRL4) and a third parallel impedance element $C_2$ is removed. This results in a further increase in the total impedance of the ramp loading circuit 320 and another decrease in the current flow between $V_{DD}$ and GND from $I_2$ to $I_1$.

Finally, in the illustrated example, during the next clock cycle, CTRL1 path may be opened and a fourth parallel impedance element $C_1$ is removed. Again, this results in an increase in the total impedance of the ramp loading circuit 320 and another decrease in the current flow between $V_{DD}$ and GND from $I_1$ to $I_0$. The above described changes in the current flow are shown in Table 2.

TABLE 2

|       | Cycle 0 | Cycle 1 | Cycle 2 | Cycle 3 | Cycle 4 | Cycle 5 |
|-------|---------|---------|---------|---------|---------|---------|
| Ctrl1 | Off     | On      | On      | On      | On      | Off     |
| Ctrl2 | Off     | On      | On      | On      | Off     | Off     |
| Ctrl3 | Off     | On      | On      | Off     | Off     | Off     |
| Ctrl4 | Off     | On      | Off     | Off     | Off     | Off     |

The clock cycles may be programmed so that upon the current flow reaching the value of $I_0$, the circuit block 210 (of FIG. 2) reaches a wake-up or active state. Since the value of the current flow has increased in stages, the current flow between the terminals $V_{DD}$ and GND has a reached a minimum value without a surge. Therefore, noise resulting from such a current surge has been reduced or eliminated. The decrease of the current flow in stages is illustrated in FIG. 5. This is in contrast to the current surge illustrated in FIG. 1.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of reducing noise resulting from a current surge in a circuit, said method comprising:
    sequentially connecting a plurality of loading elements in parallel with the circuit in response to a current surge; and
    disconnecting the loading elements, wherein a connection of each parallel loading element creates a path for current flow and a disconnection removes the current flow paths.

2. The method of claim 1 wherein said loading elements are connected during a clock cycle.

3. The method of claim 1 wherein said loading elements are connected during at least one of successive clock cycles and alternating clock cycles.

4. The method of claim 1 wherein said loading elements are connected during fractional clock cycles.

5. The method of claim 1 wherein said step of sequentially connecting the plurality of loading elements comprises increasing the current flow through said plurality of loading elements.

6. The method of claim 1 wherein said step of disconnecting the loading elements comprises sequentially disconnecting the loading elements.

7. The method of claim 1 wherein said loading elements are capacitors.

8. The method of claim 1 wherein said elements are disconnected simultaneously.

9. An apparatus for slowing a current change in a circuit, the apparatus comprising:
    a plurality of loading elements placed in parallel with the circuit, each of the elements providing a path for current flow; and
    a control circuit for selectively sequentially opening or closing at least one of said paths to prevent or enable current flow through the at least one of said paths, wherein said control circuit is configured to open the at least one path during a clock cycle.

10. An apparatus for slowing a current change in a circuit, the apparatus comprising:
    a plurality of loading elements placed in parallel with the circuit, each of the elements providing a path for current flow; and
    a control circuit for selectively sequentially opening or closing at least one of said paths to prevent or enable current flow through the at least one of said paths, wherein said control circuit is configured to open the at least one path by at least one of successive clock cycles and alternating clock cycles.

11. An apparatus for slowing a current change in a circuit, the apparatus comprising:
    a plurality of loading elements placed in parallel with the circuit, each of the elements providing a path for current flow; and
    a control circuit for selectively sequentially opening or closing at least one of said paths to prevent or enable current flow through the at least one of said paths, wherein said control circuit is configured to open the at least one path by fractional clock cycles.

12. The apparatus of claim 9 wherein said control circuit is configured to decrease the current flow to the circuit by decreasing the number of the at least one of said paths being opened.

13. The apparatus of claim 9 wherein said plurality of paths is four.

14. The apparatus of claim 9 wherein said loading elements are capacitors.

15. The apparatus of claim 9 wherein said control circuit is configured to sequentially close the at least one of said paths in response to the current change being detected.

16. A circuit for decreasing noise resulting from current surges, said circuit comprising:
    a first node;
    a second node;
    a circuit block connected between the first node and the second node; and
    a ramp loading circuit connected between the first node and the second node wherein said ramp loading circuit comprises:
        a plurality of loading elements placed in parallel with the circuit block, each of the elements providing a path for current flow; and
        a control circuit for selectively sequentially opening or closing at least one of said paths to prevent or enable current flow through the at least one of said paths, wherein said control circuit is configured to open the at least one of said paths during a clock cycle.

17. The method of claim 1, wherein said step of disconnecting the loading elements comprises sequentially disconnecting the loading elements.

18. A method of reducing noise in a circuit, said method comprising:
    determining whether a current surge is being delivered to the circuit; and
    connecting a plurality of loading elements sequentially in parallel with the circuit to decrease delivery of a current flow of the current surge to the circuit.

19. The method according to claim 18, wherein said step of connecting the plurality of loading elements comprises incrementally increasing the current flow to the circuit.

20. The method according to claim 18, wherein said step of connecting the plurality of loading elements comprises sequentially connecting the plurality of loading elements during successive clock cycles.

21. The method according to claim 18, further comprising:
   disconnecting the plurality of loading elements from the circuit.

22. The method according to claim 18, wherein said step of disconnecting the plurality of loading elements comprises disconnecting the plurality of loading elements sequentially.

23. The method according to claim 22, wherein said step of disconnecting the plurality of loading elements sequentially from the circuit comprises sequentially disconnecting the plurality of loading elements during successive clock cycles.

24. An apparatus for slowing a current change in a circuit, the apparatus comprising:
   means for determining whether a current surge is being delivered to the circuit; and
   means for incrementally increasing delivery of a current flow from the current surge to the circuit.

25. The apparatus according to claim 24, wherein the means for incrementally increasing delivery of the current flow comprises sequentially increasing the current flow to a plurality of loading element.

26. The apparatus according to claim 24, further comprising:
   means for incrementally decreasing delivery of the current flow to the circuit.

* * * * *